US011056860B2

(12) United States Patent
Familiant et al.

(10) Patent No.: US 11,056,860 B2
(45) Date of Patent: Jul. 6, 2021

(54) BUS STRUCTURE FOR PARALLEL CONNECTED POWER SWITCHES

(71) Applicant: Eaton Intelligent Power Limited, Dubin (IE)

(72) Inventors: Yakov Lvovich Familiant, Thiensville, WI (US); Andrew A. Rockhill, Waukesha, WI (US); Paul J. Rollmann, Menomonee Falls, WI (US)

(73) Assignee: Eaton Intelligent Power Limited

( * ) Notice: Subject to any disclaimer, the term of this patent is extended or adjusted under 35 U.S.C. 154(b) by 0 days.

(21) Appl. No.: 16/599,955

(22) Filed: Oct. 11, 2019

(65) Prior Publication Data

US 2021/0111542 A1    Apr. 15, 2021

(51) Int. Cl.
| | | |
|---|---|---|
| *H02B 1/20* | (2006.01) | |
| *H01L 25/07* | (2006.01) | |
| *H02G 5/00* | (2006.01) | |
| *H01L 23/52* | (2006.01) | |
| *H05K 1/02* | (2006.01) | |
| *H05K 7/14* | (2006.01) | |
| *H02M 7/00* | (2006.01) | |

(52) U.S. Cl.
CPC ............... *H02B 1/20* (2013.01); *H01L 23/52* (2013.01); *H01L 25/072* (2013.01); *H02G 5/005* (2013.01); *H02M 7/003* (2013.01); *H05K 1/02* (2013.01); *H05K 7/1432* (2013.01); *H05K 2201/10272* (2013.01)

(58) Field of Classification Search
CPC ........ H02B 1/20; H02G 5/005; H01L 25/072; H05K 2201/10272
USPC ...................................................... 174/129 B
See application file for complete search history.

(56) References Cited

U.S. PATENT DOCUMENTS

| | | | | |
|---|---|---|---|---|
| 6,333,665 B1 * | 12/2001 | Ichikawa | ............. | H03K 17/168 327/434 |
| 2004/0089934 A1 * | 5/2004 | Shimoida | ............. | H01L 25/071 257/686 |

(Continued)

FOREIGN PATENT DOCUMENTS

| | | |
|---|---|---|
| CN | 103701300 A | 4/2014 |
| EP | 3203625 A1 | 8/2017 |
| JP | 2012095472 A | 5/2012 |

OTHER PUBLICATIONS

International Search Report and Written Opinion Corresponding to International Application No. PCT/EP2020/025452; dated Jan. 21, 2021; 13 pages.

*Primary Examiner* — Sherman Ng
(74) *Attorney, Agent, or Firm* — Stanek Lemon Grouse & Meeks, P.A.

(57) ABSTRACT

An apparatus includes a plurality of semiconductor switches. A first bus interconnects first terminals of the semiconductor switches in a first chain and provides a first impedance between the first terminals of switches of the first chain. A second bus interconnects second terminals of the semiconductor switches in a second chain and provides a second impedance greater that the first impedance between the second terminals of the switches of the second chain. The apparatus may be implemented as a laminated bus assembly including respective overlapping conductor plates, wherein the second bus includes a plate having subregions defined by features, such as slots or grooves, that provide the second impedance.

12 Claims, 5 Drawing Sheets

(56) References Cited

U.S. PATENT DOCUMENTS

| | | |
|---|---|---|
| 2007/0119820 A1 | 5/2007 | Schilling et al. |
| 2010/0148298 A1* | 6/2010 | Takano ................. H01L 25/072 257/500 |
| 2015/0131348 A1* | 5/2015 | Rasoanarivo ....... H02M 5/4585 363/123 |
| 2017/0027074 A1* | 1/2017 | Ichikawa ............ H01L 23/5384 |

* cited by examiner

BUS STRUCTURE FOR PARALLEL CONNECTED POWER SWITCHES

STATEMENT OF GOVERNMENT SUPPORT

This invention was made with Government support under Contract #N00014-14-C-0123 awarded by the Office of Naval Research. The Government has certain rights in the invention.

BACKGROUND

The inventive subject matter relates to electrical power apparatus and methods and, more particularly, to bus structures for electrical power equipment.

Semiconductor switches, such as insulated gate bipolar transistors (IGBTs) and power metal-oxide-semiconductor field-effect transistors (MOSFETs), are used in a variety of different types of electrical power applications, such as in rectifiers, inverters, motor drives and the like. Solid state circuit breakers incorporating such semiconductor switches have also been developed, with the semiconductor switches being used to replace the electromechanical switches traditionally used in such devices. In such applications, semiconductor switches offer advantages of speed and resistance to environmental degradation. However, the nature of semiconductor devices can introduce new problems not associated with traditional electromechanical arrangements.

SUMMARY

Some embodiments of the inventive subject matter provide an apparatus including a plurality of semiconductor switches. A first bus interconnects first terminals of the semiconductor switches in a first chain and provides a first impedance between the first terminals of switches of the first chain. A second bus interconnects second terminals of the semiconductor switches in a second chain and provides a second impedance greater than the first impedance between the second terminals of the switches of the second chain.

In some embodiments, first and second semiconductor switches of the plurality of semiconductor switches are housed in respective first and second semiconductor packages and the second bus includes respective connection plates disposed on respective ones of the first and second semiconductor packages and at least one conductive bridge interconnecting the connection plates. The connection plates may include respective subregions of a flat plate. The flat plate may have at least one opening therein, e.g., at least one slot, that defines the subregions. In further embodiments, the flat plate may have at least one groove therein that defines the subregions.

In some embodiments, the first and second buses include first and second overlapping flat plates and the connection plates include respective subregions of the second flat plate. In some embodiments, the second flat plate may have at least one elongate slot between the subregions. In some embodiments, the second flat plate may have at least one groove between the subregions.

The first and second semiconductor switches may include respective first and second insulated gate bipolar transistors (IGBTs). The first flat plate may interconnect collector terminals of the first and second IGBTs and the second flat plate may interconnect emitter terminals of the first and second IGBTs.

In some embodiments, the first and second semiconductor packages are arranged in a first row and plurality of semiconductor switches further includes third and fourth semiconductor switches coupled in series with respective ones of the first and second semiconductor switches and housed in respective third and fourth semiconductor packages arranged in a second row parallel to the first row. A third flat plate may overlap the first and second flat plates and interconnecting first terminals of third and fourth semiconductor switches in a third chain and providing a third impedance therebetween. Second terminals of the third and fourth semiconductor switches may be connected to respective ones of the second terminals of the first and second semiconductor switches and are interconnected by the second bus.

Further embodiments of the inventive subject matter provide an apparatus including first and second semiconductor switch packages arranged in a first row, each of the first and second semiconductor switch packages including a semiconductor switch having first and second terminals. The apparatus also includes third and fourth semiconductor switch packages arranged in a second row parallel to the first row, each of the third and fourth semiconductor switch packages including a semiconductor switch having first and second terminals. The apparatus further includes a laminated bus bar assembly disposed on the first and second rows of semiconductor switch packages. The bus bar assembly includes a first plate interconnecting the first terminals of the first and second semiconductor switch packages and providing a first impedance therebetween, second plate overlapping the first plate, interconnecting the first terminals of the third and fourth semiconductor switch packages and providing a second impedance therebetween, and a third plate overlapped by the first and second plates and having a first subregion electrically connected to the second terminals of the first and third semiconductor switch packages and a second subregion electrically connected to the second terminals of the second and fourth semiconductor switch packages. The third plate has at least one feature between the first and second subregions that provides a third impedance between the second terminals of the first and second semiconductor switch packages and between the second terminals of the third and fourth semiconductor switch packages that is greater than the first and second impedances.

In some embodiments, the second plate may be a unitary flat plate having at least one slot between the first and second subregions. In some embodiments, the second plate may be a unitary flat plate having at least one groove between the first and second subregions.

The first, second, third and fourth semiconductor switch packages may each include IGBTs, the first terminals may be collector terminals and the second terminals may be emitter terminals.

The apparatus may further include respective first and second control circuit assemblies configured to drive gate terminals of the IGBTs of respective ones of the first and second semiconductor switch packages. A gate driver circuit of the second control circuit assembly may be slaved to the first control circuit assembly.

In still further embodiments of the inventive subject matter, an apparatus includes a first conductive plate configured to electrically interconnect collector terminals of first and second IGBT packages and providing a first impedance between collector terminals of the first and second IGBT packages and a second conductive plate overlapping the first conductive plate and having first and second subregions configured to electrically interconnect emitter terminals of the IGBTs in respective ones of the first and second IGBT packages. The second conductive plate has a feature between the first and second subregions that provides a second impedance between the emitter terminals of the first and second IGBT packages that is greater than the first impedance. In some embodiments, the second conductive plate may be a flat plate having at least one slot between the first and second subregions. In some embodiments, the second plate may be a flat plate having at least one groove between the first and second subregions.

DETAILED DESCRIPTION

Figure 1:
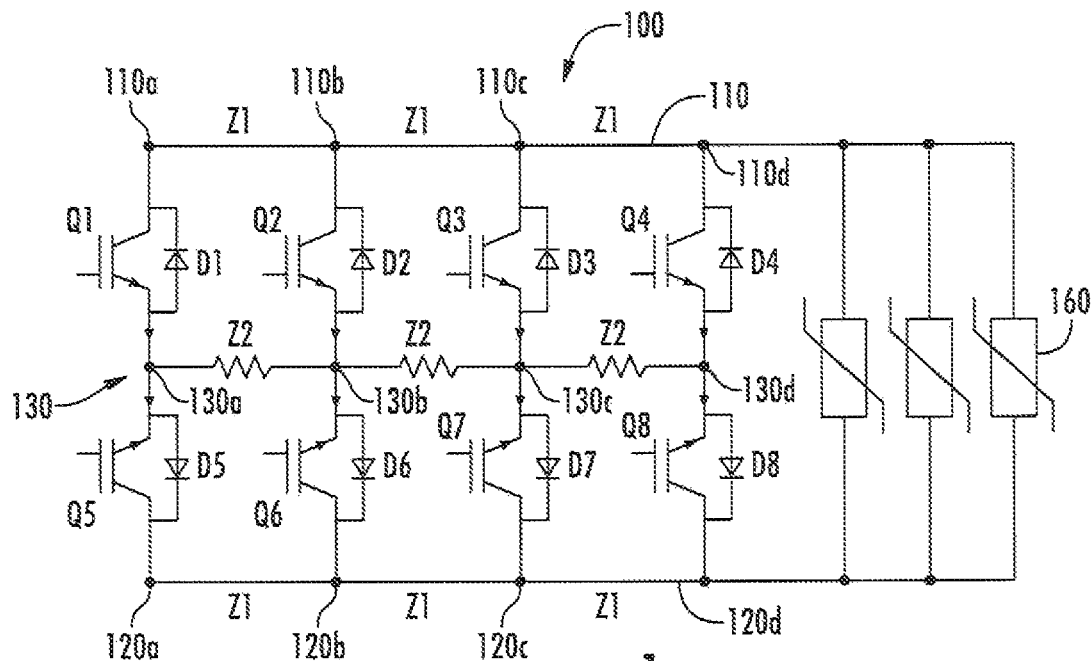
FIG. 1 is a schematic diagram of a switching circuit for a solid-state circuit breaker according to some embodiments.

Specific exemplary embodiments of the inventive subject matter now will be described with reference to the accompanying drawings. This inventive subject matter may, however, be embodied in many different forms and should not be construed as limited to the embodiments set forth herein; rather, these embodiments are provided so that this disclosure will be thorough and complete, and will fully convey the scope of the inventive subject matter to those skilled in the art. In the drawings, like numbers refer to like items. It will be understood that when an item is referred to as being "connected" or "coupled" to another item, it can be directly connected or coupled to the other item or intervening items may be present. As used herein the term "and/or" includes any and all combinations of one or more of the associated listed items.

The terminology used herein is for the purpose of describing particular embodiments only and is not intended to be limiting of the inventive subject matter. As used herein, the singular forms "a", "an" and "the" are intended to include the plural forms as well, unless expressly stated otherwise. It will be further understood that the terms "includes," "comprises," "including" and/or "comprising," when used in this specification, specify the presence of stated features, integers, steps, operations, items, and/or components, but do not preclude the presence or addition of one or more other features, integers, steps, operations, items, components, and/or groups thereof.

Unless otherwise defined, all terms (including technical and scientific terms) used herein have the same meaning as commonly understood by one of ordinary skill in the art to which this inventive subject matter belongs. It will be further understood that terms, such as those defined in commonly used dictionaries, should be interpreted as having a meaning that is consistent with their meaning in the context of the specification and the relevant art and will not be interpreted in an idealized or overly formal sense unless expressly so defined herein.

FIG. 1 is a schematic diagram of a switching circuit 100 according to some embodiments. The switching circuit 100 may be used, for example, as a circuit interruption device in a solid-state circuit breaker. The switching circuit 100 includes a first set of insulated gate bipolar transistors (IGBTs) Q1, Q2, Q3, Q4, which is coupled in series with a second set of IGBTs Q5, Q6, Q7, Q8. The IGBTs Q1, Q2, Q3, Q4, Q5, Q6, Q7, Q8 have respective diodes D1, D2, D3, D4, D5, D6, D7, D8 connected in parallel therewith. Collector terminals C of the first set of IGBTs Q1, Q2, Q3, Q4 are connected to a first bus 110 at respective nodes 110a, 110b, 110c, 110d, such that the bus 110 interconnects the collector terminals C in a daisy chain (concatenated) arrangement which provides a relatively low impedance Z1 between the electrically adjacent nodes 110a, 110b, 110c, and 110d. Similarly, collector terminals C of the second set of IGBTs Q5, Q6, Q7, Q8 are connected to a second bus 120 at respective nodes 120a, 120b, 120c, 120d, such that second bus interconnects the collector terminals C of the second set of IGBTs Q5, Q6, Q7, Q8 in a daisy chain arrangement. The second bus 120 provides a similar low impedance Z1 between the nodes 120a, 120b, 120c, 120d. Emitter terminals E of the first set of IGBTs Q1, Q2, Q3, Q4, and the second set of IGBTs Q5, Q6, Q7, Q8 are connected to nodes 130a, 130b, 130c, 130d of a third bus 130 such that the third bus 130 interconnects the emitter terminals E in a daisy chain arrangement. The third bus 130 provides a greater impedance Z2 between the nodes 130a, 130b, 130c, 130d than the impedance Z1. Metal oxide varistors (MOVs) 160 are connected to the first and second buses 110, 120 and provide overvoltage protection of the IGBTs Q1, Q2, Q3, Q4, Q5, Q6, Q7, Q8.

Figure 2:
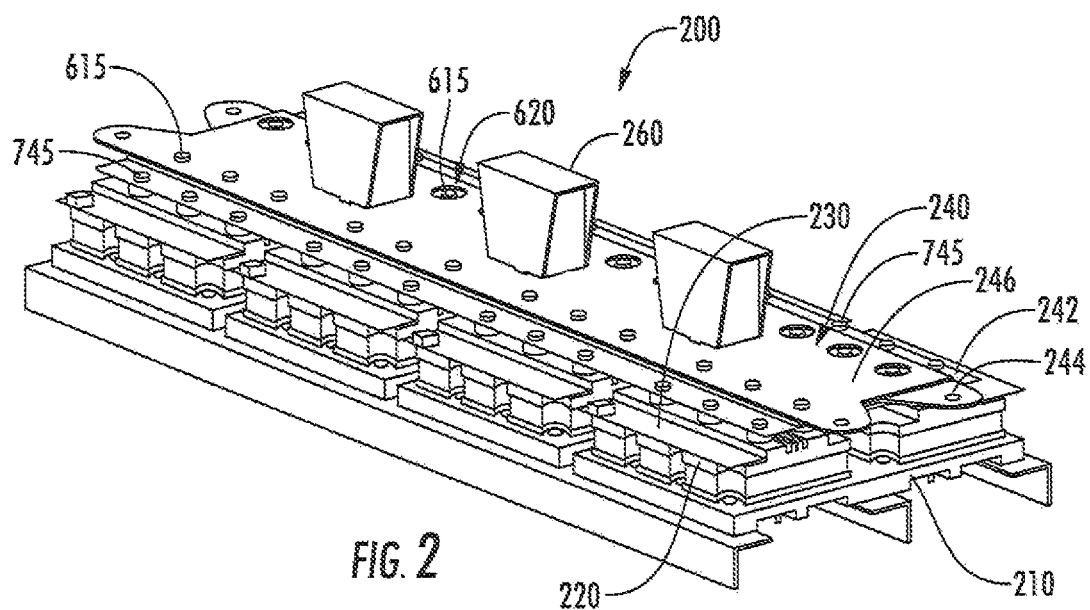
FIG. 2 is a perspective view of a switching circuit assembly according to some embodiments.
Figure 3:
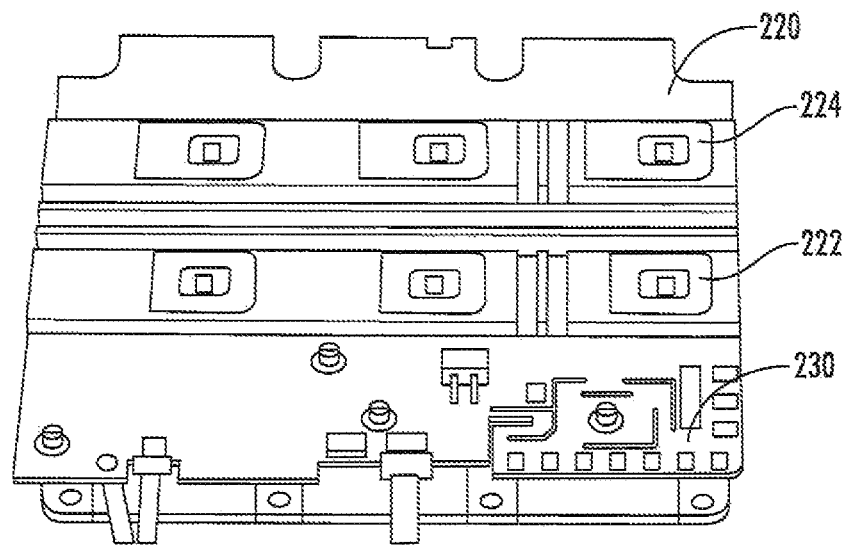
FIG. 3 is a perspective view of an insulated gate bipolar transistor (IGBT) package of the assembly of FIG. 2.

FIGS. 2-7 illustrate a switching assembly 200 that implements the circuitry shown in FIG. 1. Referring to FIG. 2, the assembly 200 includes a plurality of molded IGBT packages 220, which are mounted on a heatsink 210 and include respective groups of IGBTs that correspond to respective ones of the IGBTs Q1, Q2, Q3, Q4, Q5, Q6, Q7, Q8. As shown in FIG. 3, each IGBT package 220 includes three IGBTs that have respective pairs of emitter and collector terminals 222, 224, such that each of the IGBT packages 20 includes three emitter terminals 222 and three collector terminals 224. Each IGBT package 230 may have a control circuit 230 mounted thereon for driving gate terminals of the IGBTs in the packages 220.

A bus assembly 240 interconnects the IGBT packages in the manner discussed above with reference to FIG. 1. The bus assembly 240 includes an emitter bus plate 242 (corresponding to the third bus 130 illustrated in FIG. 1) disposed on the IGBT packages 220 and electrically connected to the emitter terminals of the IGBT packages 220. First and second collector bus plates 244, 246 (corresponding to the first and second buses 110, 120 of FIG. 1) overlap the emitter bus plate 242 and are electrically connected to collector terminals of groups of the IGBT packages 220 on respective sides of the assembly 200. MOV packages 260 housing devices corresponding to the MOVs 160 of FIG. 1, are mounted on the bus assembly 240 and are connected to the first and second collector bus plates 244, 246.

Figure 6:
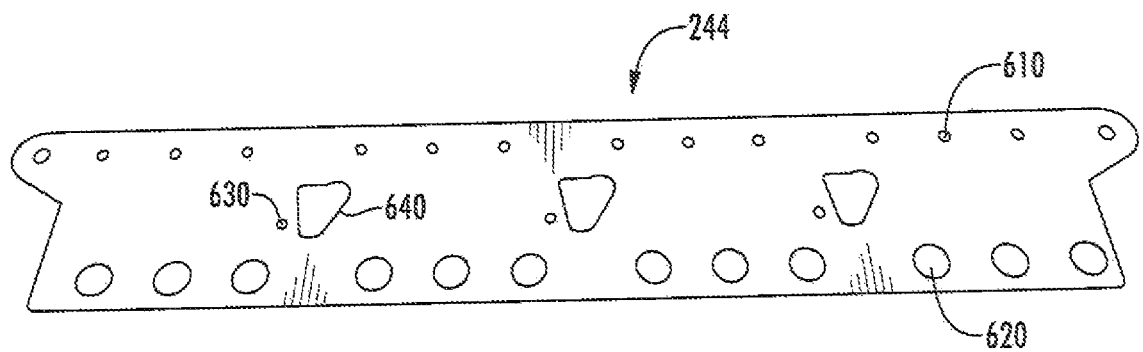
FIG. 6 is a plan view of a collector bus plate of the circuit assembly of FIG. 2.

Referring to FIGS. 2 and 6, the first collector bus plate 244 may be a generally flat copper or other conductive metal plate with various holes therein, including relatively small first holes 610 for bolts 615 that connect underlying collector terminals 224 of a first group of the IGBT packages 220 to the first collector bus plate 244, and relatively large second holes 620 that provide clearance for bolts 615 that connect the second collector bus plate 246 to underlying collector terminals 224 of a second group of the IGBT packages 220. The first bus collector plate 244 further includes relatively small holes 630 for bolts (not shown) that connect the first collector bus plate 244 to first terminals of the MOV packages 260 and relatively large openings 640 that provide clearance for bolts (not shown) that connect second terminals of the MOV packages 260 to the second collector bus plate 246. The second collector bus plate 246 has a configuration identical to that of the first collector bus plate 244. The first and second collector bus plates 244, 246 overlap one another and are laterally rotated 180 degrees with respect to one another, such that the electrical connection holes 610 of the two plates 244, 246 are arrayed in parallel and overlie respective rows of the IGBT packages 220.

Figure 7:
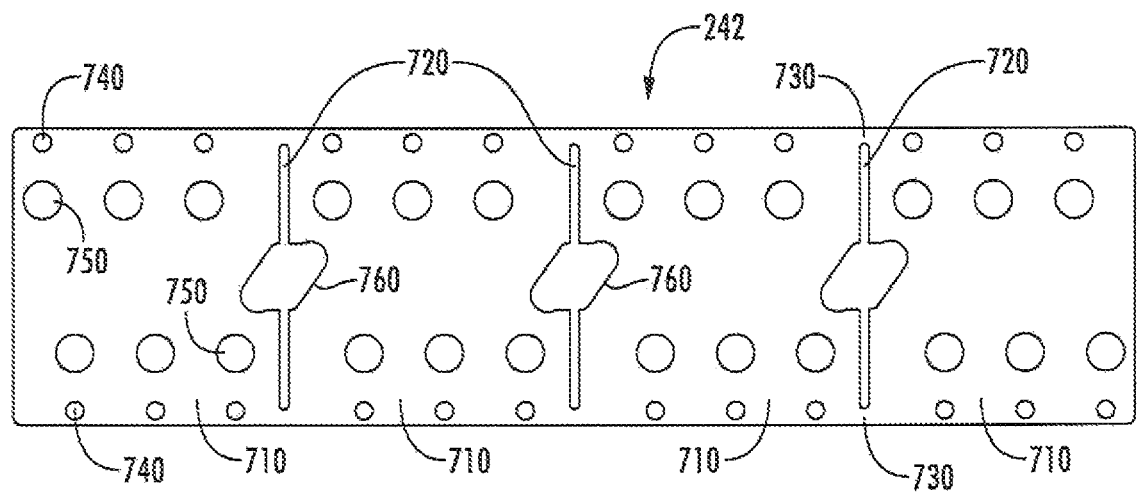
FIG. 7 is a plan view of an emitter plate of the circuit assembly of FIG. 2.

Referring to FIGS. 2 and 7, the emitter bus plate 242 includes multiple subregions or sub-plates 710 that are partially separated by slots 720 and interconnected by conductive bridges 730. Smaller first holes 740 in the emitter bus plate 242 are configured to accept bolts 745 for electrically connecting the emitter terminals of the IGBT packages 220 to the emitter bus plate 242, while larger second holes 750 provide clearance for collector terminal connections of the overlapping first and second collector bus plates 244, 246. Relatively large openings 760 provide clearance for connections of the first and second collector bus plates 244, 246 to the MOV packages 260.

The provision of the slots 720 and relatively small conductive bridges 730 between the sub-plates 710 increases impedance between the emitter terminals of adjacent ones of the IGBT package 220 in relation to the impedance provided between collector terminals of adjacent ones of the IGBT packages 220 by the collector bus plates 244, 246. Thus, the emitter bus plate 242 provides the increased inter-emitter resistance (i.e., Z2) discussed above with reference to FIG. 1, in comparison to a relatively low inter-collector impedance (i.e. Z1) provided by the collector bus plates 244, 246.

Figure 4:
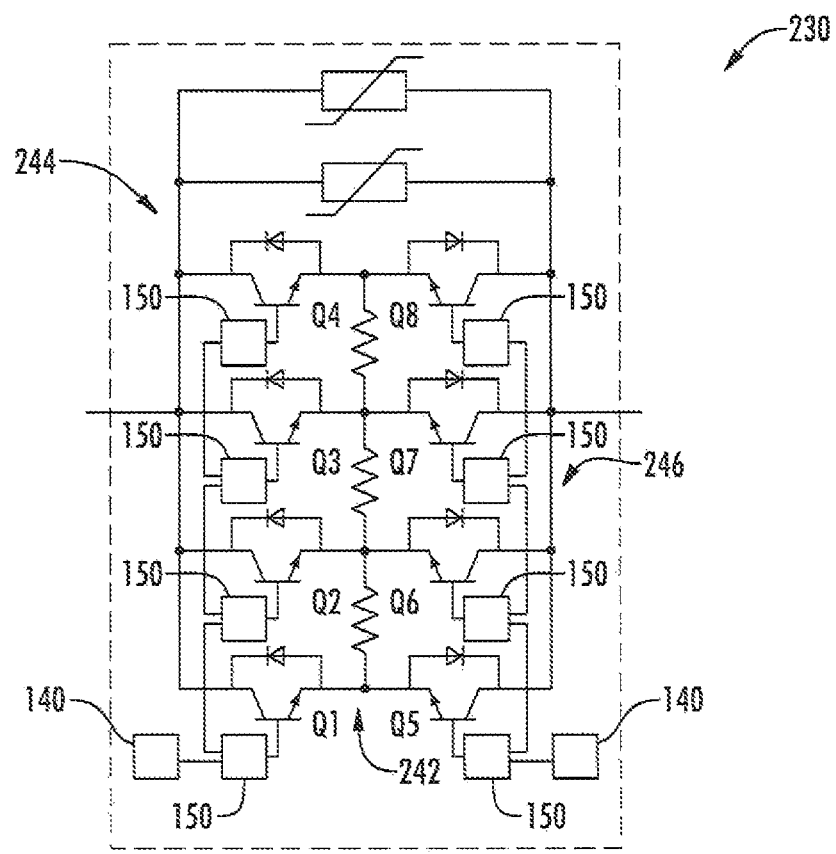
FIG. 4 is a schematic diagram for the switching circuit assembly of FIG. 2.
Figure 5:
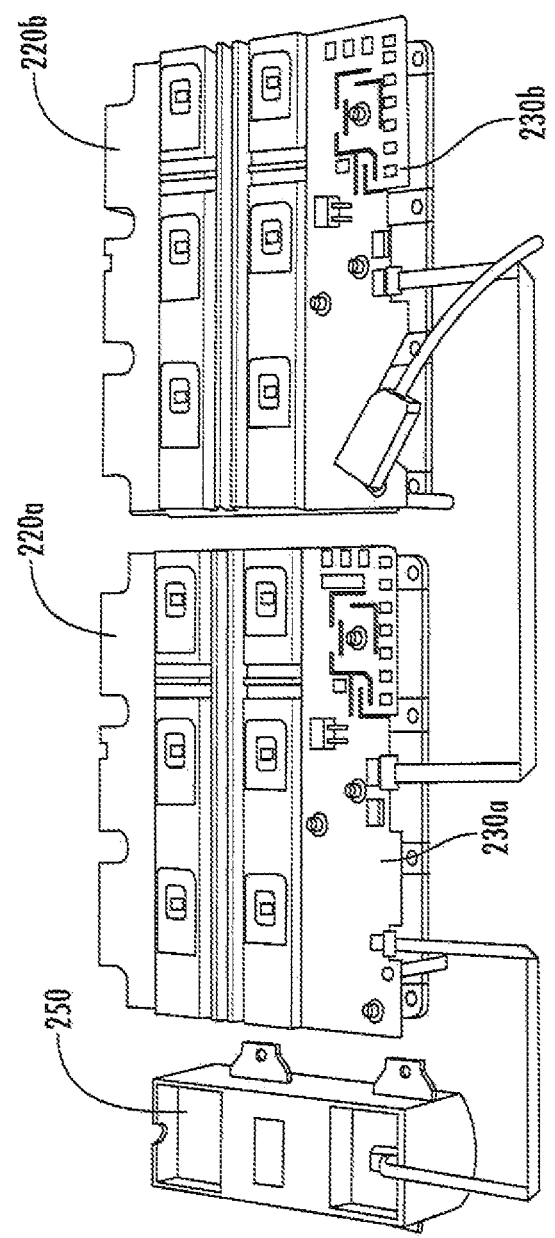
FIG. 5 is a perspective view illustrating control circuit interconnections for IGBT packages in the assembly of FIG. 2.

Referring to FIGS. 2, 4 and 5, the IGBTs of the assembly 200 may be controlled using a daisy-chained gate driver architecture. In FIG. 4, the designations Q1, Q2, Q3, Q4, Q5, Q6, Q7, Q8 respectively refer to respective groups of IGBTs in respective ones of the packages 220, e.g., Q1 refers to three transistors in a first one of the packages 220, Q2 refers to three transistors in a second one of the packages 220, and the like. The first transistor group Q1 is driven by a first gate driver circuit 150, which, as shown in FIG. 5, is included in the control circuit 230a mounted on the IGBT 220a that includes the first transistor group Q1. The first gate driver circuit 150 receives agate drive control signal from a fiber optic receiver circuit 140. A second gate driver circuit 150 drives the second transistor group Q2 responsive to a gate drive control signal from the gate driver circuit 150 associated with the first transistor group Q1. A third gate driver circuit 150 drives the third transistor group Q3 responsive to a gate drive control signal from the gate driver circuit 150 associated with the second transistor group Q2. A fourth gate driver circuit 150 drives the fourth transistor group Q4 responsive to a gate drive control signal from the gate driver circuit 150 associated with the third transistor group Q3. A similar daisy-chained control structure may be used for transistor groups Q5, Q6, Q7, Q8.

FIG. 5 illustrates an arrangement for implementing such a gate drive control architecture. As shown in FIG. 5, the transistors in a first IGBT package 220a may be driven by a gate drive circuit, e.g., a gate drive circuit corresponding to the gate drive circuit 150 of FIG. 4, included in a first control circuit assembly 230a, which receives agate drive control signal from a fiber optic receiver assembly 250, which may include a fiber optic receiver circuit corresponding to the fiber optic receiver circuit 140 of FIG. 4. The transistors in a second IGBT package 220b may be driven by a similar gate driver circuit included in a second control circuit 230b responsive to a gate drive control signal received from the first control circuit 230a.

In some solid-state circuit breaker applications, it may be desirable for the transistor groups Q1, Q2, Q3, Q4, Q5, Q6, Q7, Q8 to turn on substantially in unison to provide multiple parallel current paths between the collector bus plates. However, the IGBTs, MOSFETs, diodes and other semiconductor switches in the circuit may exhibit a negative temperature coefficient, i.e., the resistance of the switches decreases with increasing temperature. Because of this, a current imbalance may occur among parallel-connected transistors of the groups Q1, Q2, Q3, Q4 and Q5, Q6, Q7, Q8 when the devices are turned on. This can lead to undesirable current distribution in the assembly, e.g., current passing through transistor group Q1 may be diverted to transistor groups Q6, Q7, Q8, rather than being largely confined to transistor group Q5. This imbalance can be exacerbated by delay caused by the daisy-chained gate driver configuration described above, as well as by temperature differences among the IGBT packages 220. However, the increased inter-emitter impedance provided by an emitter bus, such as the emitter plate 242 shown in FIGS. 2 and 7 can cause each string (e.g., Q1/Q5, Q2/Q6, Q3/Q7, Q4/Q8) to exhibit a positive temperature coefficient, leading to a mom desirable current balance.

Figure 8:
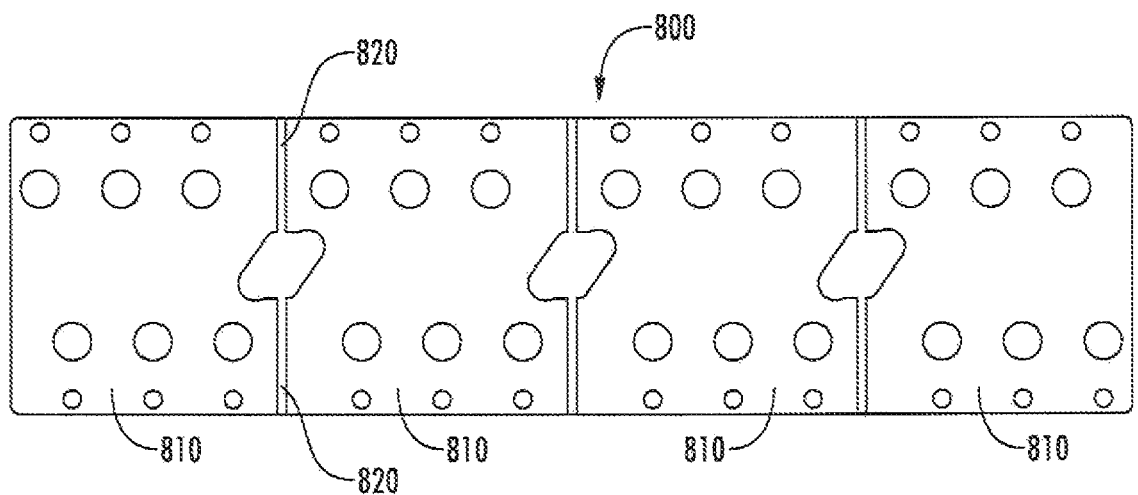
FIG. 8 is a plan view of an emitter plate according to further embodiments.
Figure 9:
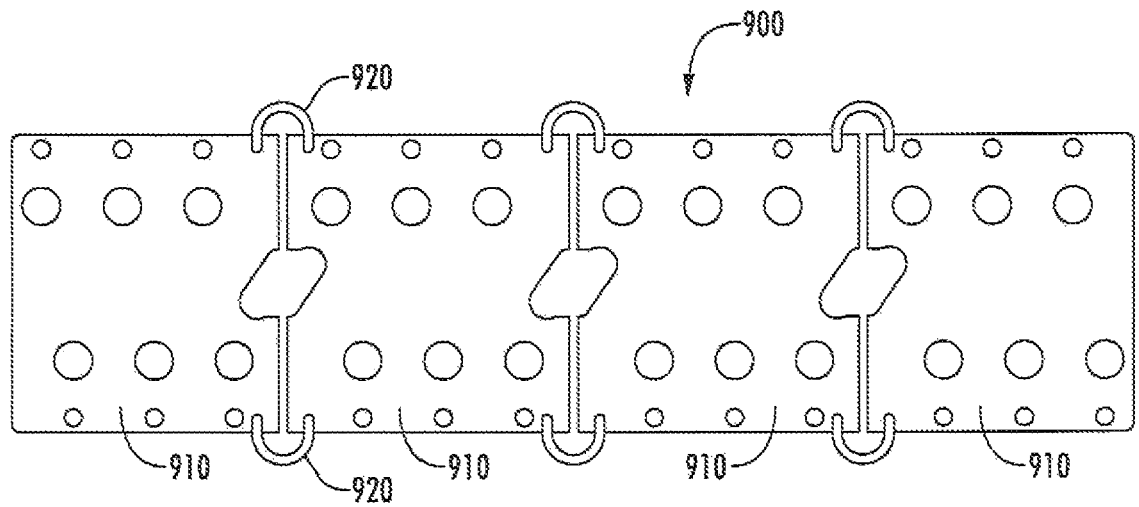
FIG. 9 is a plan view of a segmented emitter plate arrangement according to still further embodiments.

It will be appreciated that similar functionality can be provided by other emitter bus plate arrangements. For example, as shown in FIG. 8, and emitter bus plate 800 have a different structure than that shown in FIGS. 2 and 7 may include multiple subregions 810 that are separately by grooves 820, rather than slots. The grooves 820 may decrease the thickness of the emitter bus plate 800 between the subregions 810, thus providing increased impedance between the subregions 810. As show in FIG. 9, a segmented emitter bus plate 900 including a plurality of separate sub plates 910 that are electrically interconnected by jumpers 920 (e.g., wires, straps or similar conductors) may provide similar functionality.

In each of these embodiments, there may be a tradeoff between the benefits of limiting impedance between the emitter terminals of the adjacent devices to limit a potential difference between the terminals versus providing sufficient impedance to achieve a desired current balance. Accordingly, the desired amount of impedance between the emitter plate subregions may generally depend upon the voltages at which the IGBTs or other switches are operating, the nature of the switching devices, and other factors.

In the drawings and specification, there have been disclosed exemplary embodiments of the inventive subject matter. Although specific terms are employed, they are used in a generic and descriptive sense only and not for purposes of limitation, the scope of the inventive subject matter being defined by the following claims.

That which is claimed is:

1. An apparatus comprising:
   a plurality of semiconductor switches, wherein first and second semiconductor switches of the plurality of semiconductor switches are housed in respective first and second semiconductor packages;

a first bus directly connected to and interconnecting first terminals of the semiconductor switches in a first chain and provides a first impedance between adjacent ones of the first terminals in the first chain; and a second bus directly connected to and interconnecting second terminals of the semiconductor switches in a second chain and providing a second impedance greater that the first impedance between adjacent ones of the second terminals in the second chain, wherein the second bus comprises respective connection plates disposed on respective ones of the first and second semiconductor packages and at least one conductive bridge interconnecting the connection plates, wherein the connection plates comprise respective subregions of a flat plate having at least one opening therein that defines the subregions, and wherein the at least one opening comprises at least one elongate slot in the flat plate.

2. The apparatus of claim 1, wherein the first and second buses comprise first and second overlapping flat plates and wherein the connection plates comprise respective subregions of the second flat plate.

3. The apparatus of claim 2, wherein the first and semiconductor switches comprise respective first and second insulated gate bipolar transistors (IGBTs), wherein the first flat plate interconnects collector terminals of the first and second IGBTs, and wherein the second flat plate interconnects emitter terminals of the first and second IGBTs.

4. The apparatus of claim 2:
wherein the first and second semiconductor packages are arranged in a first row:
wherein the plurality of semiconductor switches comprises third and fourth semiconductor switches coupled in series with respective ones of the first and second semiconductor switches and housed in respective third and fourth semiconductor packages arranged in a second row parallel to the first row; and
a third flat plate overlapping the first and second flat plates, interconnecting first terminals of third and fourth semiconductor switches in a third chain and providing a third impedance therebetween,
wherein second terminals of the third and fourth semiconductor switches are connected to respective ones of the second terminals of the first and second semiconductor switches and are interconnected by the second bus.

5. An apparatus comprising:
a plurality of semiconductor switches, wherein first and second semiconductor switches of the plurality of semiconductor switches are housed in respective first and second semiconductor packages;
a first bus directly connected to and interconnecting first terminals of the semiconductor switches in a first chain and provides a first impedance between adjacent ones of the first terminals in the first chain; and
a second bus directly connected to and interconnecting second terminals of the semiconductor switches in a second chain and providing a second impedance greater that the first impedance between adjacent ones of the second terminals in the second chain, wherein the second bus comprises respective separate flat connection plates disposed on respective ones of the first and second semiconductor packages and at least one conductive bridge interconnecting the connection plates.

6. An apparatus comprising:
a planar array of semiconductor switch packages comprising first and second semiconductor switch packages arranged in a first row, each of the first and second semiconductor switch packages comprising a semiconductor switch having first and second terminals and
third and fourth semiconductor switch packages arranged in a second row parallel to the first row, each of the third and fourth semiconductor switch packages comprising a semiconductor switch having first and second terminals; and
a laminated bus bar assembly disposed on one side of the planar array of semiconductor switch packages and comprising first, second and third overlapping plates, wherein:
the first plate interconnects the first terminals of the first and second semiconductor switch packages and provides a first impedance therebetween;
the second plate interconnects the first terminals of the third and fourth semiconductor switch packages and provides a second impedance therebetween; and
the third plate has a first subregion electrically connected to the second terminals of the first and third semiconductor switch packages, a second subregion electrically connected to the second terminals of the second and fourth semiconductor switch packages, and at least one feature between the first and second subregions that provides a third impedance between the second terminals of the first and second semiconductor switch packages and between the second terminals of the third and fourth semiconductor switch packages that is greater than the first and second impedances.

7. The apparatus of claim 6, wherein the second third plate comprises a unitary flat plate having at least one slot therein between the first and second subregions.

8. The apparatus of claim 6, wherein second third plate comprises a unitary flat plate having at least one groove therein between the first and second subregions.

9. The apparatus of claim 6, wherein the first, second, third and fourth semiconductor switch packages each comprise IGBTs, wherein the first terminals comprise collector terminals and wherein the second terminals comprise emitter terminals.

10. The apparatus of claim 9, further comprising respective first and second control circuit assemblies configured to drive gate terminals of the IGBTs of respective ones of the first and second semiconductor switch packages, wherein a gate driver circuit of the second control circuit assembly is slaved to the first control circuit assembly.

11. An apparatus comprising:
a first conductive plate configured to electrically interconnect collector terminals of first and second IGBT packages and providing a first impedance between a collector terminal of the first IGBT package and a collector terminal of the second IGBT package; and
a second conductive plate overlapping the first conductive plate and having first and second subregions configured to electrically interconnect an emitter terminal of the first IGBT package and an emitter terminal of the second IGBT package, the second conductive plate having a feature between the first and second subregions that provides a second impedance between the emitter terminal of the first IGBT package and the emitter terminal of the second IGBT package that is greater than the first impedance, wherein the second conductive plate comprises a flat plate having at least one slot therein between the first and second subregions.

12. An apparatus comprising:
a first conductive plate configured to electrically interconnect collector terminals of first and second IGBT packages and providing a first impedance between a collector terminal of the first IGBT package and a collector terminal of the second IGBT package; and
a second conductive plate overlapping the first conductive plate and having first and second subregions configured to electrically interconnect an emitter terminal of the first IGBT package and an emitter terminal of the second IGBT package, the second conductive plate having a feature between the first and second subregions that provides a second impedance between the emitter terminal of the first IGBT package and the emitter terminal of the second IGBT package that is greater than the first impedance, wherein the second plate comprises a flat plate having at least one groove therein between the first and second subregions.

* * * * *

UNITED STATES PATENT AND TRADEMARK OFFICE
CERTIFICATE OF CORRECTION

| | |
|---|---|
| PATENT NO. | : 11,056,860 B2 |
| APPLICATION NO. | : 16/599955 |
| DATED | : July 6, 2021 |
| INVENTOR(S) | : Familiant et al. |

It is certified that error appears in the above-identified patent and that said Letters Patent is hereby corrected as shown below:

On the Title Page

(73) Assignee: Please correct Assignee to read -- Eaton Intelligent Power Limited (IE) --

(74) Attorney, Agent, Firm: Please correct the Firm name to read -- Stanek Lemon Crouse & Meeks, P.A. --

In the Claims

Column 8, Claim 7, Line 31: Please correct "second third plate" to read -- third plate --

Column 8, Claim 8, Line 35: Please correct "second third plate" to read -- third plate --

Signed and Sealed this
Tenth Day of May, 2022

Katherine Kelly Vidal
*Director of the United States Patent and Trademark Office*